United States Patent [19]
Hill

[11] Patent Number: 4,812,957
[45] Date of Patent: Mar. 14, 1989

[54] OPTICAL SYSTEM FOR UNIFORM ILLUMINATION OF A PLANE SURFACE

[75] Inventor: James D. Hill, Mount Airy, Md.

[73] Assignee: Fusion Systems Corporation, Rockville, Md.

[21] Appl. No.: 757,976

[22] Filed: Jul. 23, 1985

[51] Int. Cl.$^4$ ............................ F21V 7/00; H01J 17/20
[52] U.S. Cl. .................................. 362/263; 362/296; 313/637
[58] Field of Search ................ 362/263, 1, 256, 268, 362/296, 3, 16; 313/637-639

[56] References Cited

U.S. PATENT DOCUMENTS

| | | | |
|---|---|---|---|
| 3,296,432 | 1/1967 | Vantine | 362/1 |
| 3,296,923 | 1/1967 | Miles | 362/268 |
| 3,720,460 | 3/1973 | Wilkinson | 362/263 |
| 3,872,349 | 3/1975 | Spero et al. | 315/39 |
| 3,911,318 | 10/1975 | Spero et al. | 315/39 |
| 3,941,475 | 3/1976 | Sheets | 362/268 |
| 4,001,632 | 1/1977 | Haugsjaa et al. | 362/263 |
| 4,042,850 | 8/1977 | Ury et al. | 315/39 |
| 4,427,921 | 1/1984 | Proud et al. | 313/637 |
| 4,480,213 | 10/1984 | Lapatovich et al. | 313/637 |
| 4,485,332 | 11/1984 | Ury et al. | 315/112 |
| 4,517,630 | 5/1985 | Dieffenbach et al. | 362/268 |
| 4,673,846 | 6/1987 | Yoshizawa et al. | 315/39 |

FOREIGN PATENT DOCUMENTS

| | | | |
|---|---|---|---|
| 305151 | 7/1916 | Fed. Rep. of Germany | 362/268 |
| 401754 | 1/1943 | Italy | 362/268 |

Primary Examiner—David A. Okonsky
Attorney, Agent, or Firm—Pollock, Vande Sande & Priddy

[57] ABSTRACT

An optical system for uniformly illuminating a plane surface using a non-uniform source of light, a focusing reflector to direct the light rays emanating from the source, and, optionally, a collimating lens. The collimating lens has its axis coincident with the axis of the reflector and is spaced from the light source so that the limiting aperture of the reflector is at or near the focal point of the collimating lens. A microwave energized source may be used to provide a non-uniform source having the desired characteristics.

12 Claims, 10 Drawing Sheets

OPTICAL SYSTEM FOR UNIFORM ILLUMINATION OF A PLANE SURFACE

This invention relates to systems for providing a surface with uniform illumination, and more specifically, to systems wherein light rays from a non-uniform light source are directed in such a manner as to uniformly illuminate a flat surface.

BACKGROUND OF THE INVENTION

There are a variety of applications using a light source for which uniform illumination of a surface is desirable. For example, some degree of uniformity is desirable when projecting an image onto a reflective screen for viewing motion pictures. Although some of these applications do not require high uniformity of illumination of the surface, others do. For example, processes for exposing photoresists in methods of manufacturing microcircuits in which lines to be formed on a surface may be of the order of one micron apart, require a high degree of uniformity of illumination.

In general, many systems which image a light source on a plane surface to be illuminated produce uniform illumination of that surface only if there is uniform emission of light from the source. However, the angular distribution of radiation from some sources is more uniform than the spatial distribution. That is, although various points within the source have different intensities, the angular distribution of radiation from each point is substantially uniform. This fact has been taken advantage of in prior art systems as shown in FIGS. 1 and 2.

In the prior art system shown in FIG. 1, light rays emanating from source 10 pass through condenser lens 16, consisting of lens 12 and lens 14, which images the light source onto objective lens 18. Rays from lens 18 pass through collimating lens 20 and illuminate plane surface 22.

In this system, the uniformity of illumination on the image plane 22 depends on the uniformity of light coming from condenser lens set 16 which in turn is dependent upon the uniformity of angular distribution of radiation from source 10. In this system, the variation of light at the image plane 22 is greater than about 5 percent, which is inadequately uniform for some purposes.

In the prior art system shown in FIG. 2, the uniformity of light at the image plane 22 has been improved by replacing a part of the condenser lens of FIG. 1 with a composite lens 24 comprising field lenses 24a, 24b and 24c. Each of these field lenses produces an image of the source onto a corresponding objective lens 26 comprising lenses 26a, 26b and 26c, each of which in turn produces an image of its associated field lens on image plane 22. Collector lens 28 serves the function of merging the images from the objective lens into one image at plane 22.

Prior art systems, such as the one shown in FIG. 2, have been useful in producing substantially uniform light on a plane surface. However, the combination of lenses required by the system is complex and expensive, and a more simple system which provides a high uniformity of illumination on a surface is desirable.

Systems not having complex lens arrangements but instead having a focusing reflective lens have been used in the prior art to direct light rays from a light source in a desired direction. Examples of such systems are disclosed in U.S. Pat. No. 3,872,349 to Spero et al, for "Apparatus and Method for Generating Radiation". In the system disclosed in Spero et al, a microwave-generated plasma light source is disposed inside an parabolic reflector at or near the focal point of the reflector. Light rays from the source are reflected outwardly in a parallel fashion. One goal of systems such as those disclosed in U.S. Pat. No. 3,872,349 was to direct as much emitted light as possible at an object being irradiated without regard to the uniformity of the illumination falling on the object. Since it was well-known that a light source at the focal point of a focusing reflector, such as an elliptical or a parabolic reflector, will not uniformly illuminate a surface, the potential of the combination of a light source and a focusing reflector in providing uniform illumination on a surface was not recognized in the prior art.

The invention disclosed herein is based on the unexpected discovery that light rays emitted from a volume source at or near the focal point of a focusing reflector are reflected in pathways which combine in such a manner as to provide uniform illumination of a surface, and furthermore, that the illumination on the surface is highly uniform even when the source itself is non-uniform.

SUMMARY OF THE INVENTION

It is accordingly one object of the invention to provide an optical system for uniformly illuminating a surface employing a non-uniform light source.

In accordance with the invention, there is provided an optical system for uniformly illuminating a surface comprising:
  a focusing reflector for reflecting light rays; and
  a volume light source having a spatially non-uniform emission of light from point to point throughout the volume of the source, said volume source being disposed in front of said focusing reflector at or near its focal point.

In one aspect of the invention, the source of light comprises an enclosed body of luminous gas, the horizon of which appears, relative to the center, brighter near the poles and dimmer near the equator, or conversely, dimmer near the poles and brighter near the equator when viewed from a position near the equatorial plane, wherein the poles are points on the surface of the source which are on the axis of the focusing reflector, the equator represents the points on the surface of said source in a plane through the geometrical center of the source and normal to the axis of said focusing reflector, and the horizon is a perimeter of the source viewed from any point outside the source.

In a further aspect of the invention, a collimating lens is provided to collimate light rays which are reflected from the focusing reflector to provide both uniform and telecentric illumination on the image plane. The collimating lens is disposed between the image plane and the light source in a plane parallel to the image plane and at a distance from the light source so that the limiting aperture of the focusing reflector is at or near the focal point of the collimating lens.

The uniformity of light illumination of the image plane achieved by the system described herein is unexpected in view of the well-known fact that a light source at the focal point of focusing reflectors such as elliptical and parabolic reflectors will not uniformly illuminate a surface.

The system described herein achieves a high degree of uniformity, yet the components are relatively simple.

This system is especially useful in exposing photoresists in processes for making microcircuits.

The term "focusing reflector" as used herein refers to reflecting surfaces which define a surface of revolution, or an approximate surface of revolution, and include elliptical, parabolic, spherical, and other less mathematically defined reflectors. For example, focusing reflectors which are useful could be constructed by assembling a series of rings or flat segments around a common axis. An elliptical reflector would be theoretically the best; however, at ratios of the distance from the reflector to the image plane to the focal distance of the reflector greater than about 5 (i.e., for image ratios greater than 5:1) there is no practical difference between an elliptical and a parabolic reflector.

The term "telecentric" refers to a condition in which the angular distribution of rays is the same at all points on the image plane.

The term "limiting aperture" refers to the area encompassed by the perimeter of the focusing reflector, or any more limiting aperture which is in front of the focusing reflector.

BRIEF DESCRIPTION OF THE DRAWINGS

FIG. 8d is a graph showing the variation of light intensity for the light source of FIG. 8 as measured by a photometer viewing the source along line y—y of FIG. 8a.

DETAILED DESCRIPTION OF THE INVENTION

While this invention contemplates the use of other non-uniform sources of radiation, the system is particularly well adapted for use with an electrodeless light source, and the invention will be illustrated in detail by describing such a system. Electrodeless light sources are well known, and are described, for example, in U.S. Pat. No. 4,485,332. In general, a bulb containing a plasma-forming medium is disposed in a microwave cavity comprising a reflector and a mesh, and microwave energy is coupled to the cavity to excite the lamp.

In carrying out this invention, electromagnetically-coupled electrodeless lamps in which the light source is energized by electromagnetic waves in the range from radio frequency waves through microwaves may be used.

Figure 1:
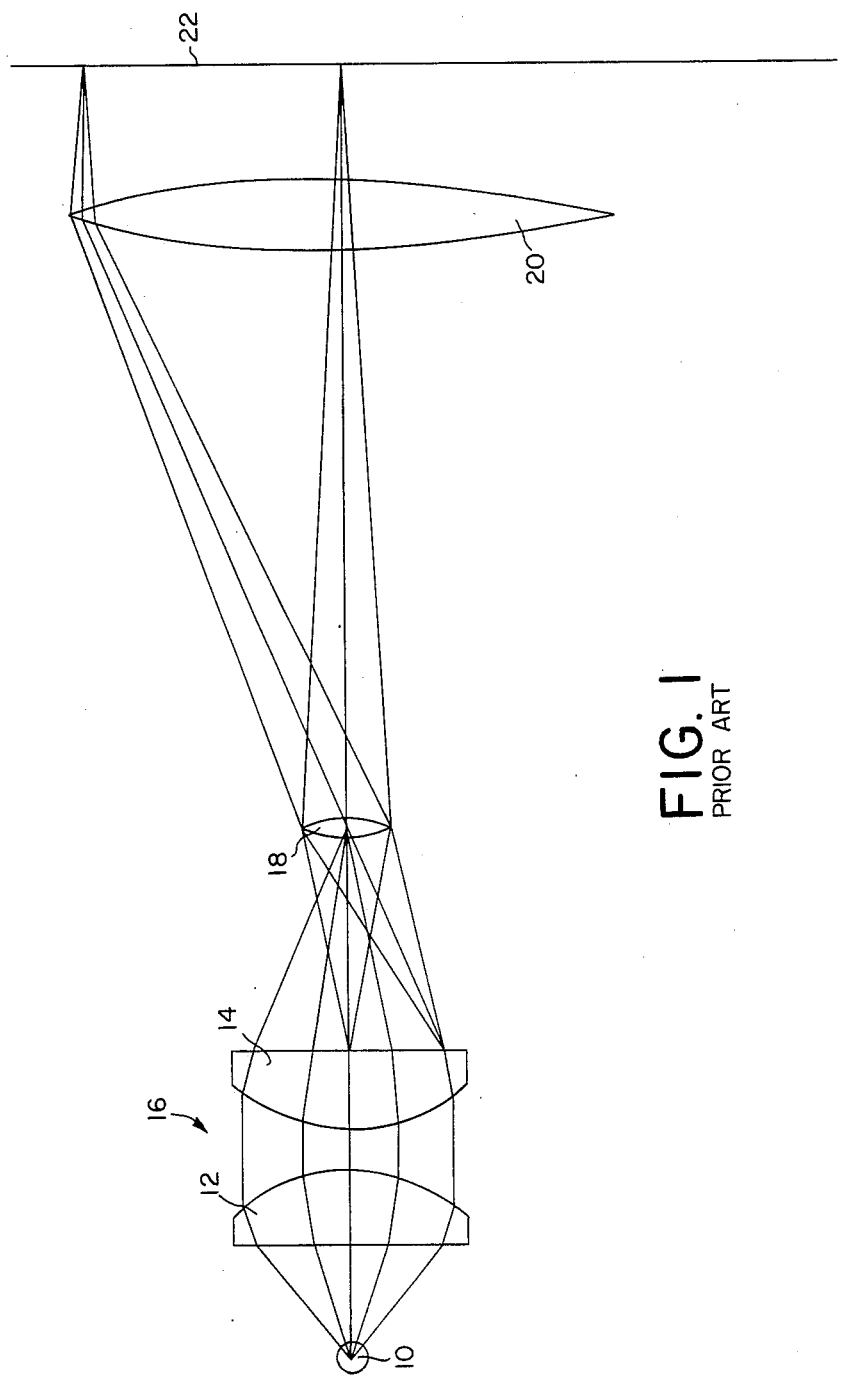
FIG. 1 is a diagrammatic representation of one prior art system for uniformly illuminating a surface using a non-uniform radiation source.
Figure 2:
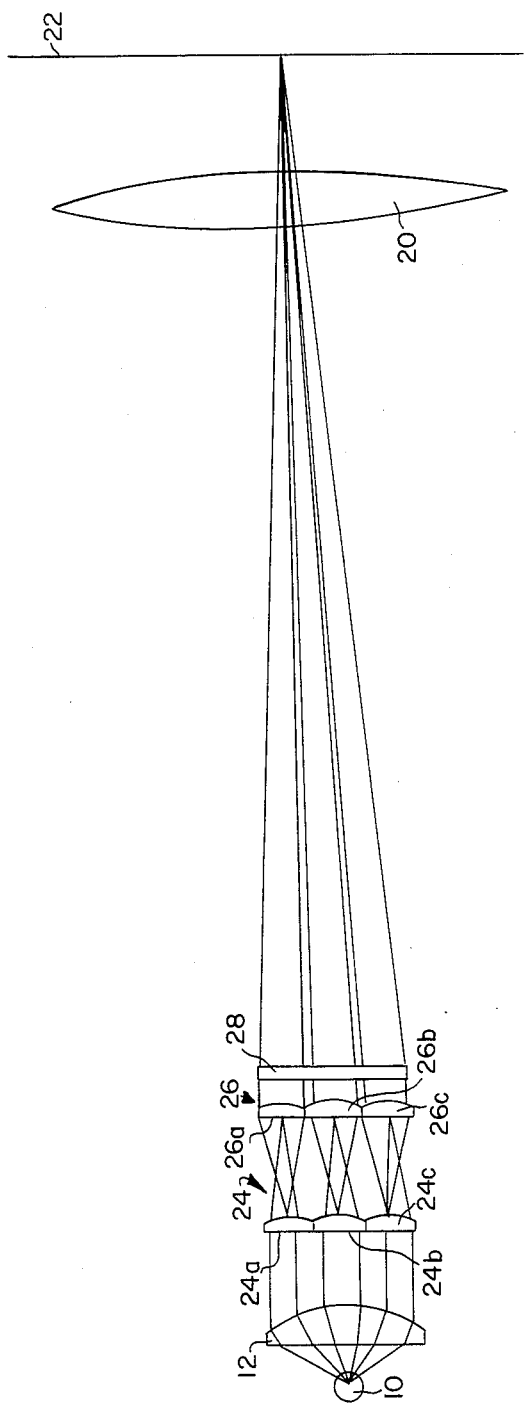
FIG. 2 is a diagrammatic representation of another prior art system for uniformly illuminating a surface using a non-uniform radiation source.
Figure 3:
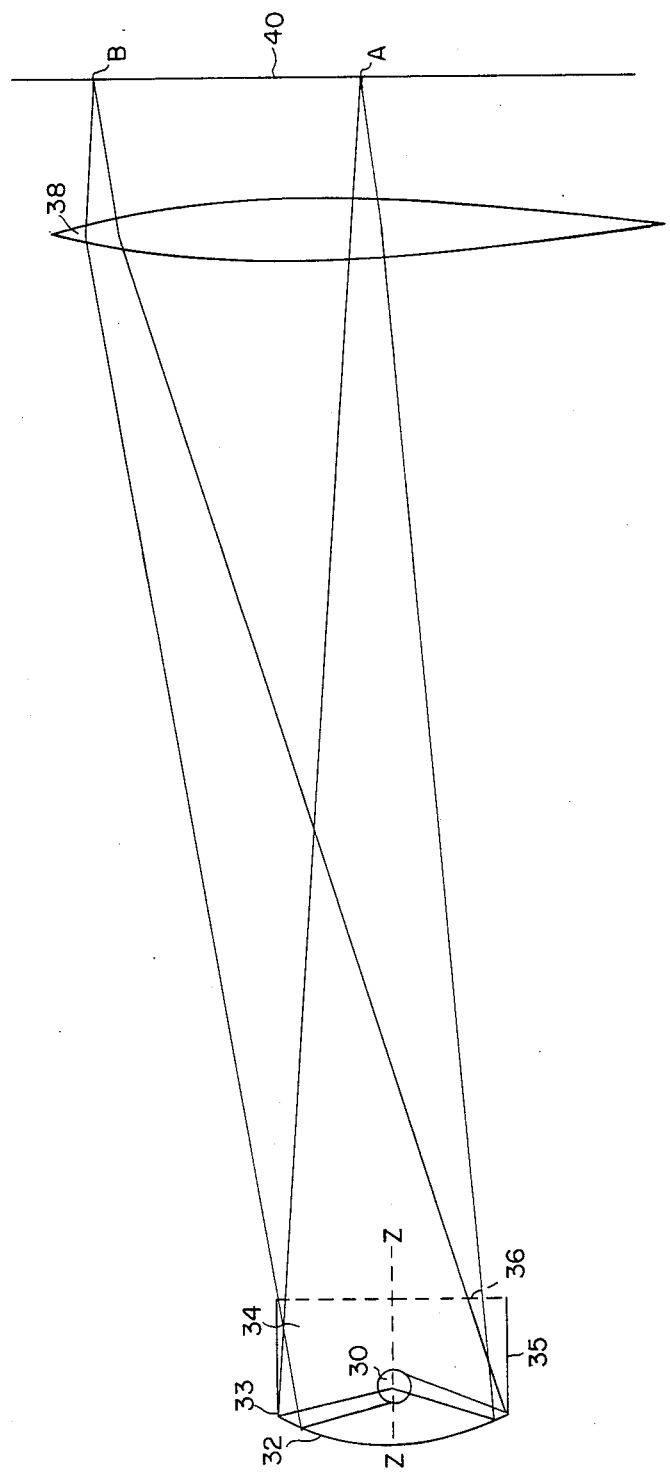
FIG. 3 is a diagrammatic representation of a system of the present invention for uniformly illuminating a surface using a non-uniform light source.

In the system as shown in FIG. 3, radiation source 30 is exemplified by a spherical fused quartz bulb filled with a plasma-forming medium which is excited by microwave energy which is coupled to microwave cavity 34. Cavity 34 is bounded on one side by screen 36 and on the other by elliptical reflector 32, the optical axis of which is z—z. Cylindrical body 35 which electrically connects the perimeter 33 of focusing reflector 32 with screen 36 has a non-reflecting conductive inner surface. Light rays emanating from bulb 30 are reflected from reflector 32 towards collimating lens 38 and impinge on image plane 40.

Point A is the point at which the optical axis of the system passes through image plane 40. Although light emanates principally from the surface of spherical source 30, rays can be traced from the center of source 30 to point A. In fact, any ray traced from the center of bulb 30 and striking reflector 32 can be traced to point A.

Figure 5:
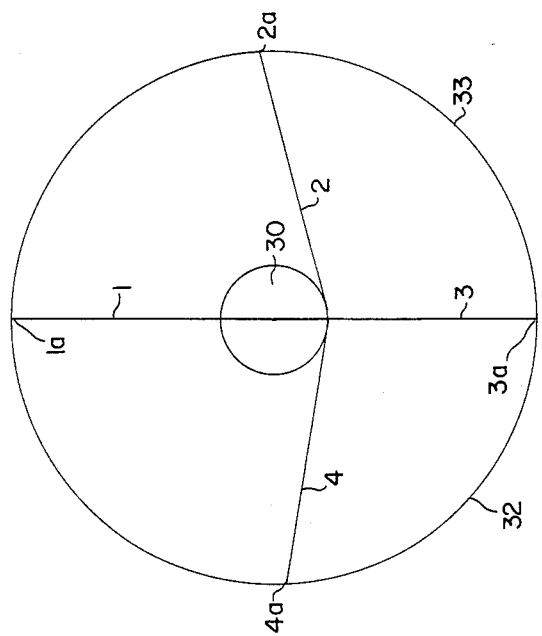
FIGS. 4 and 5 are diagrammatic representations of side and front views, respectively, showing an arrangement of a light source and an elliptical reflector in accordance with the invention and illustrating pathways of light rays which strike the elliptical surface.
Figure 4:
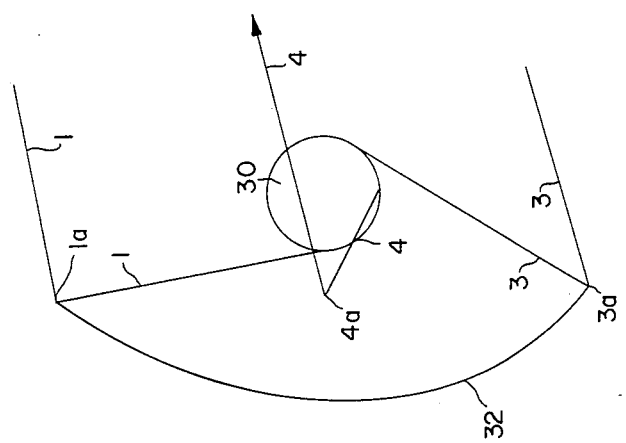

The analysis of rays reaching point B on image plane 40 is not as simple as will be shown by referring to FIGS. 4 and 5. FIGS. 4 and 5 show details of four rays which reach point B after reflecting from the extreme edge of reflector 32. As shown in FIG. 4, rays 1 and 3 emanate tangentially from the surface of source 30, as do rays 2 and 4 as shown in FIG. 5. These rays are representative of those which reach point B since all rays which are traced from the source 30 and which reach point B on image plane 40 emanate tangentially from the source. Furthermore, no rays which reflect from the extreme edge of reflector 32 strike the image plane 40 further from point A than is point B. Point B lies on a circle which is the boundary of that part of the image plane which is illuminated by the entire reflector 32 and that circle is the perimeter of that part of the image plane which is illuminated uniformly.

When the perimeter of the focusing reflector is a circle of a fixed diameter and location, a circle through point B in the image plane will be largest when the center of the light source is in the plane of the perimeter of the focusing reflector, and the reflector is designed to accommodate that position for the light source. The light source is ideally at or near the plane defining the perimeter of the reflector.

Figure 7:
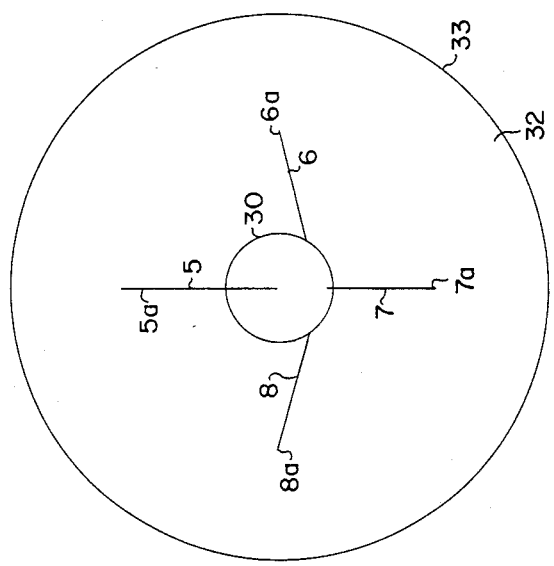
FIGS. 6 and 7 are diagrammatic representations of side and front views, respectively, showing a light source and associated elliptical reflector in accordance with the invention which illustrate pathways of light rays which strike the reflector at points closer to the center than are shown in FIGS. 4 and 5.
Figure 6:
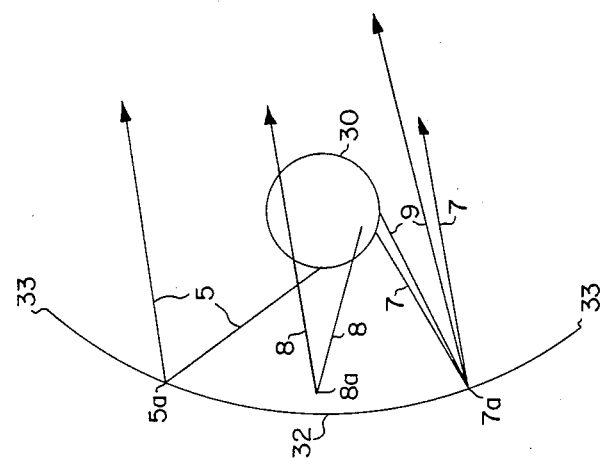

FIGS. 6 and 7 are analogous to FIGS. 4 and 5 and depict rays 5, 6, 7 and 8 which emanate from the surface of the source, strike the reflector 32 at points closer to its center than do the rays 1–4 shown in FIGS. 4 and 5, and which reach point B. Ray 9 shown in FIG. 6, which emanates tangentially from source 30, and which strikes reflector 32 at the same point as does ray 7, strikes the image plane at a point more distant from point A of FIG. 3 than point B and falls outside the useful area of illumination. Thus, the more central region of reflector 32 produces a larger image of the source on the image plane than does the outer part of reflector 32.

The microwave cavity of FIG. 3 is driven by microwaves to produce an oscillating electric field parallel to the axis of the cavity which is coincident with the optical axis of the system. The gas inside bulb 30 is excited by this field and emits light which has an intensity pattern as shown in FIGS. 8b, 8c and 8d.

Figure 8A:
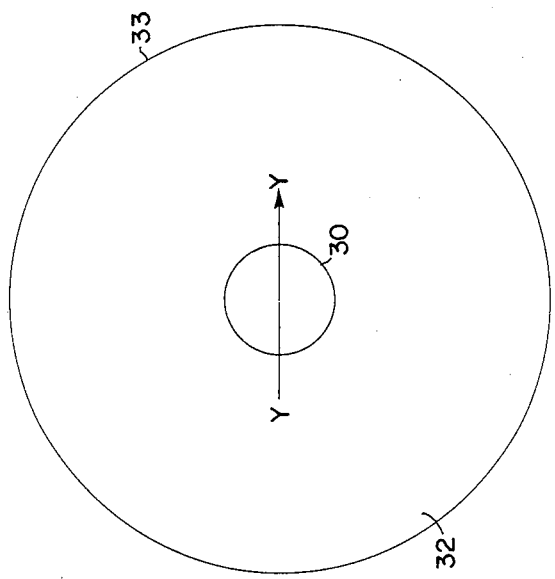
FIG. 8a is a diagrammatic representation of a front view of the light source of FIG. 8.
Figure 8:
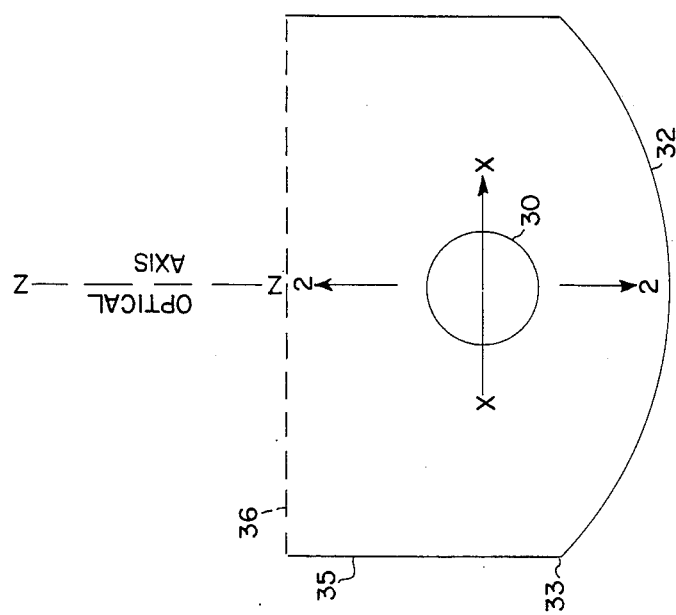
FIG. 8 is a diagrammatic representation of a side view of a light source within a microwave cavity.
Figure 8C:
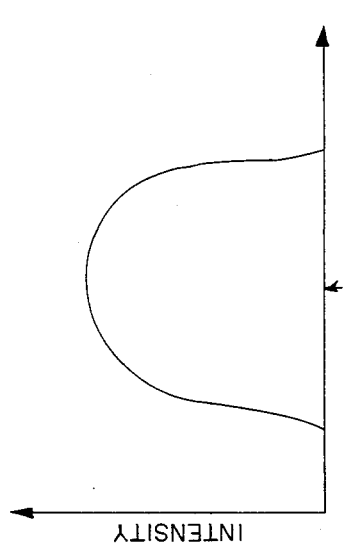
FIG. 8c is a graph showing the variation of light intensity for the light source of FIG. 8 as measured by a photometer viewing the source along a line parallel to the microwave electric field.
Figure 8D:
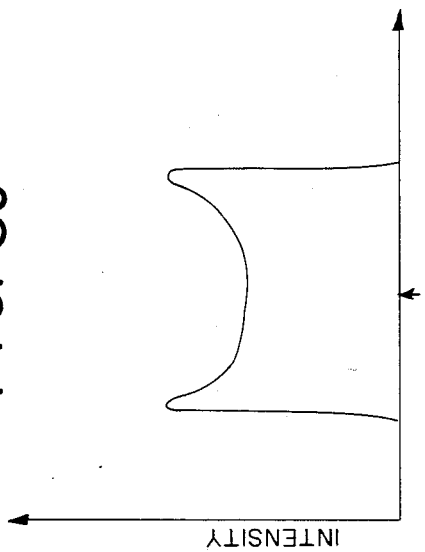
Figure 8B:
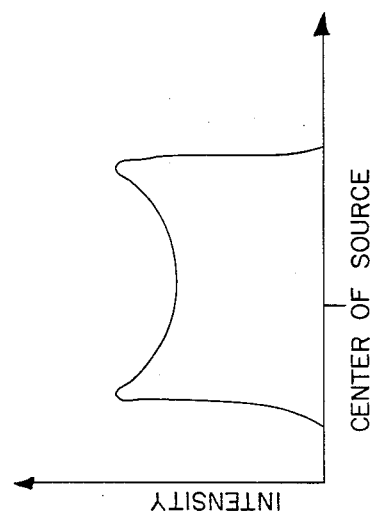
FIG. 8b is a graph showing the variation of light intensity for the light source of FIG. 8 as measured by a photometer viewing the source along line x—x of FIG. 8 from a direction perpendicular to the microwave electric field.

FIG. 8b shows the intensity pattern as measured by a photometer which views the source from a direction perpendicular to the electric field depicted as lines e—e and scans the bulb in a direction perpendicular to the electric field as shown by line x—x of FIG. 8. The intensity pattern thus revealed results from the facts that the source is a hollow spherical shell of radiating gas and that the gas in the center of the source does not provide much radiation. The source appears more intense where the surface is viewed at an angle because of the apparent greater thickness of the surface layer.

FIG. 8c shows a somewhat different intensity pattern when the source is scanned in a direction parallel to the electric field along line e—e. This pattern results from the facts that the source is brighter where the field is parallel to the surface and the source is covered by a layer of relatively cold, somewhat absorbent gas in the region where the field is perpendicular to the surface.

FIG. 8d shows the result of scanning along a path through the center of the source along line y—y of FIG. 8a with the photometer viewing the source from a direction parallel to the electric field. The resulting intensity pattern is a logical result of the foregoing description of the source.

The source as described has the appearance of a sphere, the horizon of which appears, relative to the center, brighter near the equator and dimmer near the poles, wherein the poles are points of the source which are on the axis of the reflector and the equator is a great circle on the surface of the source in a plane normal to the axis of the reflector, and the horizon is a perimeter of the source viewed from any point outside the source.

If desired, the relative positions of brightness and dimness can be reversed by use of a circularly polarized microwave field with the electrical field perpendicular to the optical axis.

While the light source has been described as being spherical, light sources having other geometrical shapes may be used. For example, light sources in the shape of spheroids or oblate spheroids may be used. However, a departure from a substantially spherical or spheroidal shape provides no advantages.

Figure 9:
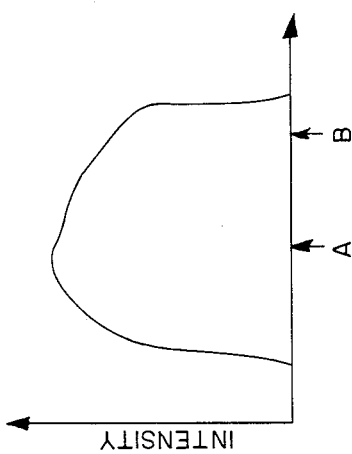

FIGS. 9 through 14 illustrate the intensity of light along a line lying in the image plane and passing through points A and B of FIG. 3. FIG. 9 illustrates the contribution to the intensity of this line due to the light reflected by point 1, FIGS. 4 and 5.

Figure 10:
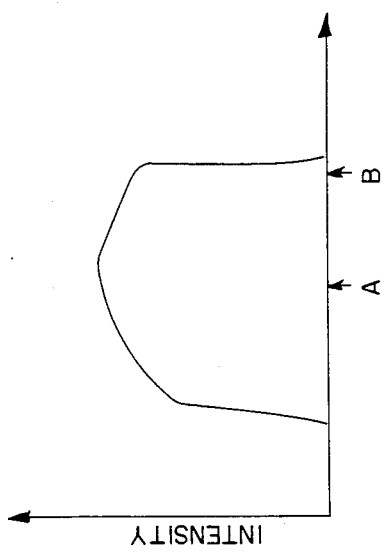
FIGS. 9 through 14 illustrate the changes of intensity of light along a line lying in the image plane and passing through points A and B of FIG. 3.
Figure 11:
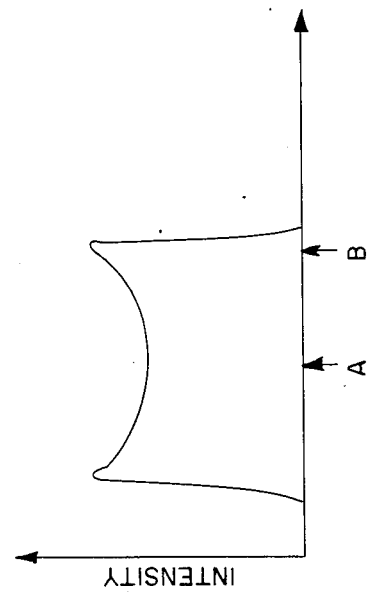

FIG. 10 illustrates the contribution of light due to point 3, FIGS. 4 and 5, and FIG. 11 illustrates the contribution due to points 2 and 4. These intensity patterns are the result of the intensity pattern of the source as described above. The sum of contributions of points 1, 2, 3 and 4 is a more or less uniform illumination of the line through points A and B.

Figure 12:
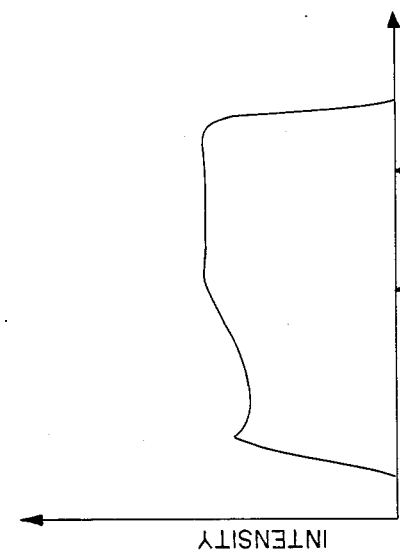

FIG. 12 is based on point 5 of FIGS. 6 and 7.

Figure 13:
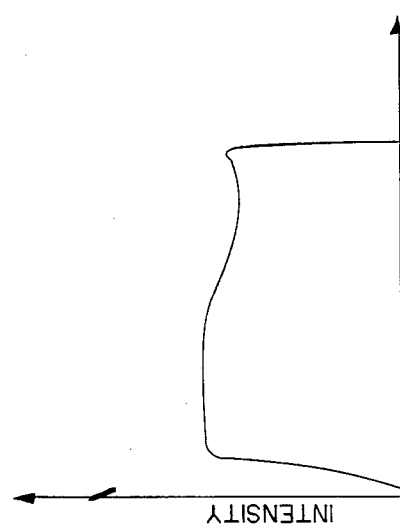
Figure 14:
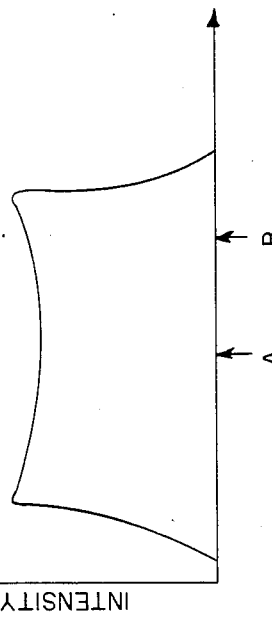

FIG. 13 is based on point 7, and FIG. 14 is based on points 6 and 8. These points illuminate a greater length of the line through A and B.

The sum of the contribution of points 5, 6, 7 and 8 is a reasonably uniform illumination of the line for all points as close or closer to point A as is point B.

There are an infinite number of points on the reflector and, although only representative ones can be described, it can be seen that the elliptical reflector distributes the light from the source in such a way that the non-uniformities of the source tend to cancel, resulting in the uniformity of illumination. Because of the axial symmetry of the system, the uniformity of illumination along the line through A and B applies to all points on the image plane which are no more distant from A as is B.

Figure 15:
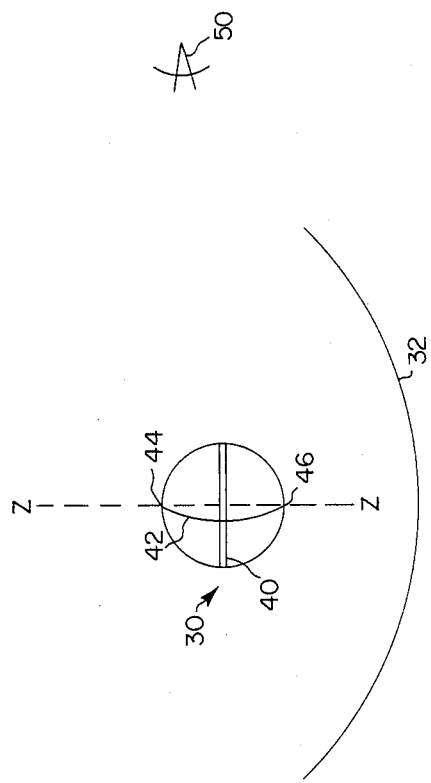
FIG. 15 illustrates relative positions of poles, the equator and horizon and a view from a position near the equatorial plane.

FIG. 15 is presented to illustrate the positions of poles 44, 46, the equator 40 and the horizon 42 of volume light source 30 when viewed from position 50 which is near the equatorial plane.

As noted above, reflectors other than elliptical reflectors which will reflect light from the source onto an image plane in a similar manner sufficiently well to illuminate the image plane uniformly can be used. These reflectors include parabolic, spherical or other less mathematically well-defined surfaces.

While the image plane will be uniformly illuminated in the absence of a collimating lens, for some purposes it is important for all light rays striking the image plane to be telecentric, i.e., the angular distribution of rays at all points in the image plane are the same. The light rays can be made telecentric by inserting a collimating lens between the image plane and the light source at a distance from the light source so that the limiting aperture of the reflector is at or near the focal point of the collimating lens.

Having thus described the invention, the following Example is provided to illustrate it in more detail.

EXAMPLE

A system constructed in accordance with FIG. 3 has a microwave cavity bounded by a cylindrical wall 3.7 inches in diameter and 2 inches wide, a screen at one end of the cylinder and a parabolic reflector at the other end. The parabolic reflector has its focal point on the axis of the cylinder. The source is a bulb filled with mercury gas and is energized by microwaves having a power level of 1.5 KW to produce ultraviolet light at a wavelength of from 200 to 240 nanometers. A collimating lens having its axis coincident with the axis of the parabolic reflector is placed 24 inches from the focal point of the parabolic reflector. The focal point is at the plane defined by the perimeter of the focusing reflector. The illumination level on the image plane varies by no more than four percent over the useful area.

A parabolic reflector is used in the system described in this Example because of its ready availability, since the ratio of the distance from the reflector to the image plane to the distance from the focal point to the image plane is sufficiently great so that there is no practical difference between an elliptical and a parabolic reflector.

What is claimed is:

1. An optical system for imaging a non-uniform light source onto an image plane to provide uniform illumination on said image plane, comprising:

a focusing reflector for reflecting light rays; and a source of light disposed on the optical axis of the reflector and on or near the focal point of the reflector, said source comprising an enclosed body of luminous gas, the horizon of which appears, relative to the center, brighter near the poles and dimmer near the equator, or brighter near the equator and dimmer near the poles when viewed from a position near the equatorial plane, wherein said poles are points of the source which are on the optical axis of the focusing reflector, the equator represents points on the surface of said source in a plane through the geometrical center of the source and normal to said axis of said focusing reflector, and the horizon is a perimeter of the source viewed from any point outside the source;

wherein said light source is a bulb wherein said luminous gas is generated by a plasma forming medium and said focusing reflector forms a portion of a microwave cavity in which said bulb is located, and further including a collimating lens disposed between the image plane and the light source at a distance from the light source so that the limiting aperture of the reflector is at or near the focal point of said lens, whereby light emanating from said source provides uniform and telecentric illumination on said image plane.

2. An optical system for imaging a non-uniform light source onto an image plane to provide uniform illumination on said plane, comprising:

a focusing reflector for reflecting light rays;

a source of light disposed on the axis and on or near the focal point of said focusing reflector, said source having the appearance of a sphere, the horizon of which appears, relative to the center, brighter near the poles and dimmer near the equator, or brighter near the equator and dimmer near the poles when viewed from a position near the equatorial plane, wherein said poles are points of the source which are on the axis of the focusing reflector, the equator is a great circle on the surface of said source in a plane normal to the axis of said focusing reflector, and the horizon is a perimeter of the source viewed from any point outside the source;

and wherein said source of light is a bulb containing a plasma forming medium and said focusing reflector forms a portion of a microwave cavity in which said bulb is located.

3. An optical system for imaging a non-uniform light source onto an image plane to provide uniform illumination on said image plane, comprising:

a focusing reflector for reflecting light rays; and a source of light disposed on the optical axis of the reflector and on or near the focal point of the reflector, said source comprising an enclosed body of luminous gas, the horizon of which appears, relative to the center, brighter near the poles and dimmer near the equator, or brighter near the equator and dimmer near the poles when viewed from a position near the equatorial plane, wherein said poles are points of the source which are on the optical axis of the focusing reflector, the equator represents points on the surface of said source in a plane through the geometrical center of the source and normal to said axis of said focusing reflector, and the horizon is a perimeter of the source viewed from any point outside the source.

4. The optical system of claim 3 or 1 wherein said focusing reflector is an elliptical reflector.

5. The optical system of claim 3 or 1 wherein said focusing reflector is a parabolic reflector.

6. The optical system of claim 3 or 1 wherein said focusing reflector comprises a series of rings or flat segments arranged around a common axis.

7. The optical system of claim 3 wherein said light source is a bulb wherein said luminous gas is generated by a plasma forming medium and said focusing reflector forms a portion of a microwave cavity in which said bulb is located.

8. The optical system of claims 3 or 7 further including a collimating means located in the optical path between said focusing reflector and said image plane.

9. The optical system of claim 8 wherein said collimating means comprises a collimating lens.

10. The optical system of claim 9 wherein said collimating lens is disposed at a distance from said light source so that the limiting aperture of the reflector is at or near the focal point of the lens.

11. The optical system of claim 10 wherein said collimating lens is disposed in a plane parallel to the image plane.

12. An optical system for imaging a non-uniform light source onto an image plane to provide uniform illumination on said image plane, consisting of:

a focusing reflector for reflecting light rays; and a source of light disposed on the optical axis of the reflector and on or near the focal point of the reflector, said source comprising an enclosed body of luminous gas, the horizon of which appears, relative to the center, brighter near the poles and dimmer near the equator, or brighter near the equator and dimmer near the poles when viewed from a position near the equatorial plane, wherein said poles are points of the source which are on the optical axis of the focusing reflector, the equator represents points on the surface of said source in a plane through th geometrical center of the source and normal to said axis of said focusing reflector, and the horizon is a perimeter of the source viewed from any point outside the source;

said light source being a bulb wherein said luminous gas is generated by a plasma forming medium and said focusing reflector forming a portion of a microwave cavity in which said bulb is located.

* * * * *